United States Patent
Lin et al.

(10) Patent No.: US 9,521,778 B2
(45) Date of Patent: Dec. 13, 2016

(54) CONFIGURABLE AIR BAFFLE FOR DIRECTING AIRFLOW WITHIN INFORMATION HANDLING SYSTEMS

(71) Applicant: DELL PRODUCTS L.P., Round Rock, TX (US)

(72) Inventors: Kuang Hsi Lin, TaouYuan County (TW); Yen-Lin Wang, Taipei (TW); Chih Min Su, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 14/635,841

(22) Filed: Mar. 2, 2015

(65) Prior Publication Data

US 2016/0262286 A1 Sep. 8, 2016

(51) Int. Cl.
*H05K 7/20* (2006.01)
*G06F 1/20* (2006.01)

(52) U.S. Cl.
CPC ............ *H05K 7/20145* (2013.01); *G06F 1/20* (2013.01); *H05K 7/20181* (2013.01); *H05K 7/20563* (2013.01); *H05K 7/20727* (2013.01)

(58) Field of Classification Search
CPC ............ H05K 7/20145; H05K 7/20618; H05K 7/20181; G06F 1/20; G06F 1/206; G06F 2200/201

USPC ....... 361/679.49–679.51, 695–697; 454/184; 165/96

See application file for complete search history.

(56) References Cited

U.S. PATENT DOCUMENTS

| | | | | |
|---|---|---|---|---|
| 6,477,044 | B2* | 11/2002 | Foley | H05K 7/1417 361/695 |
| 7,345,873 | B2* | 3/2008 | Dey | G06F 1/20 361/691 |
| 7,403,387 | B2* | 7/2008 | Pav | G06F 1/20 361/694 |
| 7,663,881 | B2* | 2/2010 | Kuo | G06F 1/20 312/223.2 |
| 7,876,559 | B2* | 1/2011 | Shabbir | H05K 7/20727 165/104.33 |
| 2015/0055283 | A1* | 2/2015 | Zhang | G06F 1/184 361/679.5 |
| 2015/0060015 | A1* | 3/2015 | Zhang | G06F 1/20 165/96 |

* cited by examiner

*Primary Examiner* — Zachary M Pape
(74) *Attorney, Agent, or Firm* — Baker Botts L.L.P.

(57) ABSTRACT

An air baffle for directing air within an information handling system is disclosed. The air baffle includes an open region configured to permit passage of an airflow, a closed region configured to obstruct passage of the airflow, and a variable region between the open region and the closed region. The air baffle further includes an adjustable tab configured to obstruct passage of the airflow. The variable region is configured to permit and obstruct passage of the airflow based on a position of the adjustable tab with respect to the variable region.

19 Claims, 5 Drawing Sheets

CONFIGURABLE AIR BAFFLE FOR DIRECTING AIRFLOW WITHIN INFORMATION HANDLING SYSTEMS

BACKGROUND

1. Field of the Disclosure

This disclosure relates generally to information handling systems and more particularly to configurable air baffles for directing airflow within information handling systems.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may process, store, and communicate information and may include one or more computer systems, data storage systems, and networking systems.

Components within various information handling systems may expend power as the information handling systems process and store information. As the components expend power, the components may heat up. Generating and directing airflow within the information handling systems may facilitate cooling the components so that the information handling systems operate correctly.

SUMMARY

In one aspect, a disclosed air baffle for directing air within an information handling system may include an open region configured to permit passage of an airflow and a closed region configured to obstruct passage of the airflow. The air baffle may also include an adjustable tab configured to obstruct passage of the airflow. The air baffle may further include a variable region between the open region and a side of the closed region, the variable region configured to permit and obstruct passage of the airflow based on a position of the adjustable tab with respect to the variable region.

Another disclosed aspect includes an information handling system with a fan configured to generate an airflow, an upstream component and a downstream component configured to be cooled by the airflow, and an air baffle arranged between the upstream and the downstream components. The air baffle may be configured to direct the airflow. The air baffle may include an open region configured to permit passage of the airflow and a closed region configured to obstruct passage of the airflow. The air baffle may also include an adjustable tab configured to obstruct passage of the airflow. The air baffle may further include a variable region between the open region and a side of the closed region, the variable region configured to permit and obstruct passage of the airflow based on a position of the adjustable tab with respect to the variable region.

Another disclosed aspect includes a method for directing air within an information handling system. The method may include determining a thermal impedance parameter associated with cooling an upstream area and/or a downstream area of the information handling system on opposite sides of an air baffle. The method may also include adjusting the position of an adjustable tab with respect to a variable region on the air baffle to regulate a thermal impedance between the upstream area and the downstream area to satisfy the thermal impedance parameter.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

Throughout this disclosure, a hyphenated form of a reference numeral refers to a specific instance of an element and the un-hyphenated form of the reference numeral refers to the element generically or collectively. Thus, as an example (not shown in the drawings), widget "12-1" refers to an instance of a widget class, which may be referred to collectively as widgets "12" and any one of which may be referred to generically as a widget "12". In the figures and the description, like numerals are intended to represent like elements.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a server, a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Particular embodiments are best understood by reference to FIGS. 1-5 wherein like numbers are used to indicate like and corresponding parts.

Figure 1:
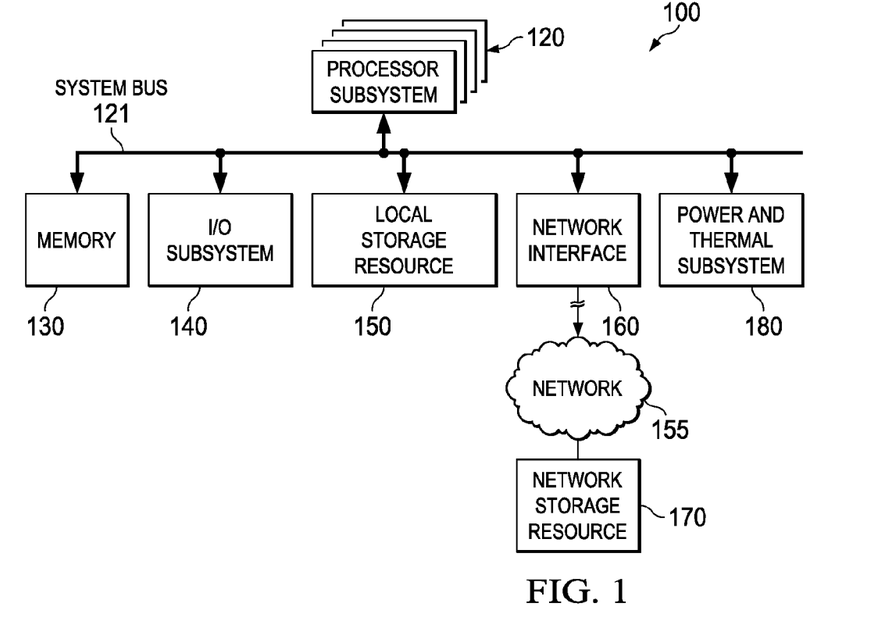
FIG. 1 is a block diagram of selected functional elements of an embodiment of an information handling system.

FIG. 1 illustrates a block diagram of selected functional elements of an embodiment of an information handling system 100. As discussed above, information handling system 100 may be used to process and store information for various purposes. As will be described in more detail below, information handling system 100 may include various systems and apparatuses such as fans and air baffles to control airflow within information handling system 100 to cool information handling system 100. In FIG. 1, external or remote elements such as network 155 and network storage resource 170 are also shown to give context to an environment in which information handling system 100 may be configured to operate.

As shown in FIG. 1, components of information handling system 100 may include, but are not limited to, processor subsystem 120, which may comprise one or more processors, and system bus 121 that communicatively couples various system components to processor subsystem 120 including, for example, memory subsystem 130, I/O subsystem 140, local storage resource 150, network interface 160, and power and thermal subsystem 180. System bus 121 may represent a variety of suitable types of bus structures, such as a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI Express (PCIe) bus, HyperTransport (HT) bus, and Video Electronics Standards Association (VESA) local bus.

In FIG. 1, network interface 160 may include a suitable system, apparatus, or device operable to serve as an interface between information handling system 100 and a network 155. Network interface 160 may enable information handling system 100 to communicate over network 155 using a suitable transmission protocol and/or standard, including, but not limited to, transmission protocols and/or standards enumerated below with respect to the discussion of network 155. In some embodiments, network interface 160 may be communicatively coupled via network 155 to network storage resource 170. Network 155 may be implemented as, or may be a part of, a network attached storage (NAS), a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network 155 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 155 and its various components may be implemented using hardware, software, or any combination thereof. In certain embodiments, information handling system 100 and network 155 may be included in a rack domain.

As depicted in FIG. 1, processor subsystem 120 may comprise a system, device, or apparatus operable to interpret and/or execute program instructions and/or process data, and may include one or more microprocessors, microcontrollers, digital signal processors (DSPs), application specific integrated circuits (ASICs), or other digital or analog circuitry configured to interpret and/or execute program instructions and/or process data. In some embodiments, processor subsystem 120 may interpret and/or execute program instructions and/or process data stored locally (e.g., in memory subsystem 130). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as information handling system 100, is powered down.

In FIG. 1, local storage resource 150 may comprise computer-readable media (e.g., hard disk drive, solid state drive, floppy disk drive, CD-ROM, and/or other types of rotating storage media, flash memory, EEPROM, and/or other types of solid state storage media) and may be generally operable to store instructions and/or data. For example, local storage resource 150 may store executable code in the form of program files that may be loaded into memory subsystem 130 for execution. In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces.

As shown, information handling system 100 may also include a power and thermal subsystem 180. Power and thermal subsystem 180 may be implemented in any suitable manner. For example, power and thermal subsystem 180 may include one or more components such as power supplies, power controllers, fans, fan controllers, heat sinks, air baffles, etc., configured to provide power to components within information handling system 100 and to ensure that thermal design constraints for the components are met (e.g., by cooling the components). Accordingly, certain components included within information handling system 100 (e.g., components within processor subsystem 120, memory 130, etc.) may operate by consuming power provided by power and thermal subsystem 180. In certain examples, designers of information handling system 100 may budget and account for power expected to be consumed by one or more of the components and may design power and thermal subsystem 180 to include an appropriate power supply configured to power the components.

Additionally, power and thermal subsystem 180 may be configured to cool components within information handling system 100 to ensure that the components satisfy various thermal design constraints. For example, thermal design constraints may be satisfied when an airflow passes over a component or through a heat sink associated with the component in order to properly cool the component. As such, power and thermal subsystem 180 may include one or more fans to generate the airflow, as well as one or more air baffles to direct the airflow as may suit particular components in particular embodiments. In certain examples, an air baffle may be configurable or customizable to regulate a thermal impedance between one or more areas of information handling system 100 by directing the airflow moving between the areas. For example, as will be described in more detail below, an air baffle may control the thermal impedance such that a large portion of the airflow is directed to components that consume a large amount of power (e.g., CPUs) and a smaller portion of the airflow is directed to components that consume a smaller amount of power (e.g., memory DIMMs).

Figure 2A:
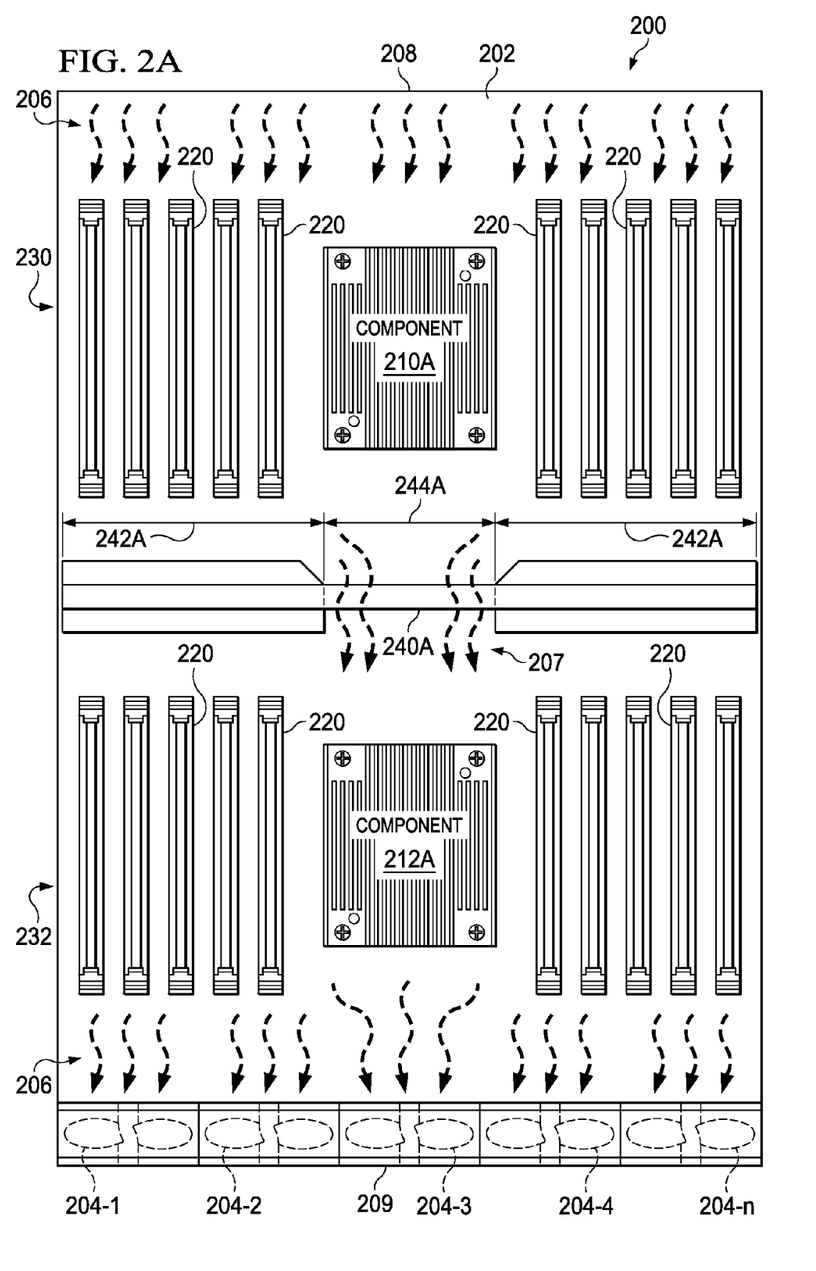
FIG. 2A is a block diagram of selected hardware elements of an embodiment of an information handling system having relatively narrow components to be cooled.
Figure 2B:
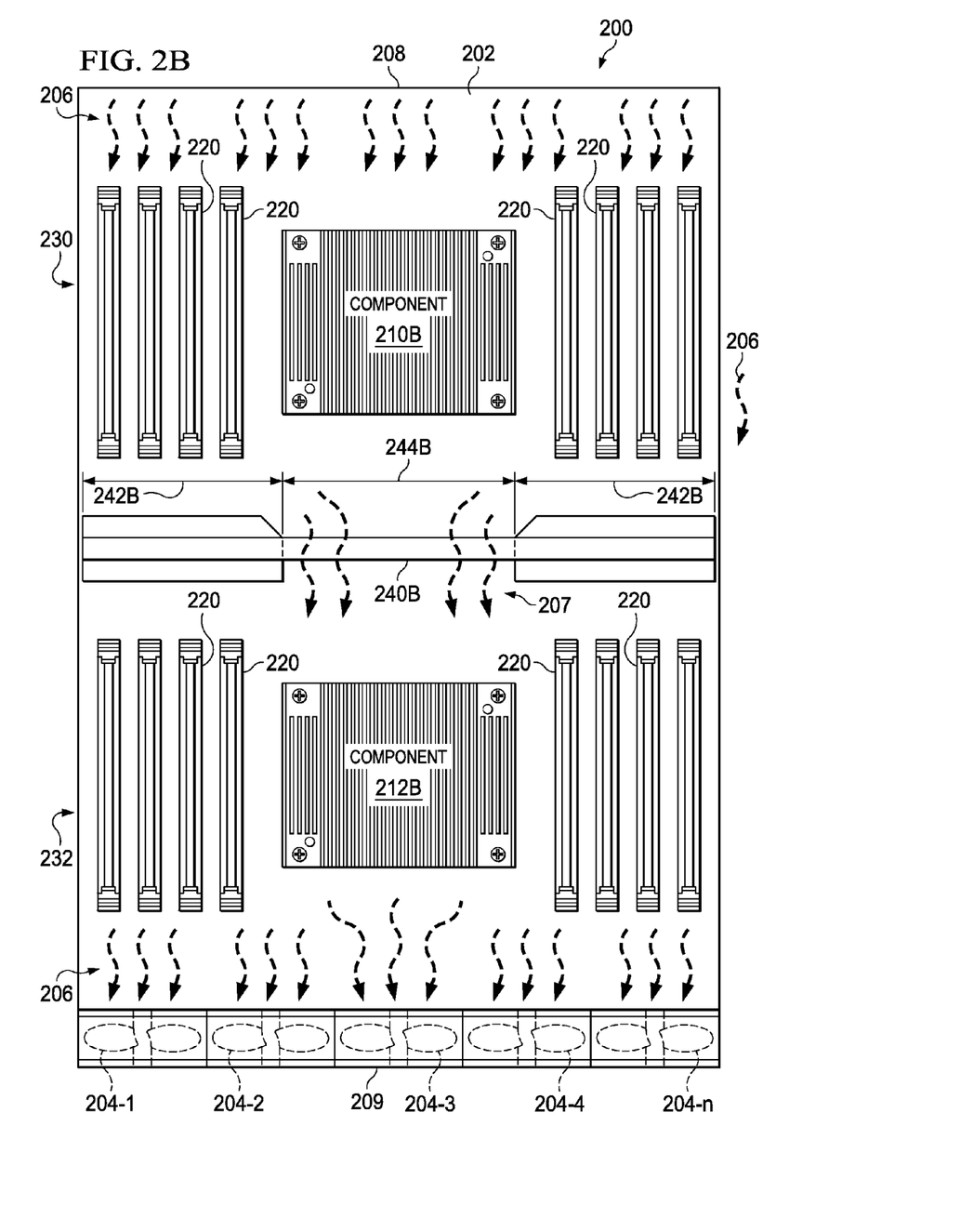
FIG. 2B is a block diagram of selected hardware elements of an embodiment of an information handling system having relatively wide components to be cooled.

FIGS. 2A and 2B (collectively, FIG. 2) are block diagrams of selected hardware elements of two embodiments of an information handling system 200. Specifically, FIG. 2A shows the embodiment of the information handling system having relatively narrow components to be cooled. FIG. 2B shows the embodiment of the information handling system having relatively wide components to be cooled. FIGS. 2A and 2B may have many similarities that will be discussed referring to FIG. 2 generally. Certain differences between elements of FIGS. 2A and 2B may be called out by appending "A" or "B" to the reference numbers. The selected differences between FIGS. 2A and 2B, including the differences between elements labeled with an "A" and elements labeled with a "B," will be discussed below.

FIG. 2 shows a component layout view of certain exemplary hardware components of information handling system 200. The components shown in FIG. 2 are not drawn to scale and information handling system 200 may contain additional or fewer components than the components shown in FIG. 2. Components of information handling system 200 may be interconnected with each other as well as with other components not shown in FIG. 2. For example, information handling system 200 may be interconnected with one or more other information handling systems. However, connections between components may be omitted in FIG. 2 for descriptive clarity. In FIG. 2, information handling system 200 may implement an embodiment of information handling system 100 described above with respect to FIG. 1.

As shown in FIG. 2, information handling system 200 may include circuit board 202. Although not shown in FIG. 2, circuit board 202 may be associated with one or more additional circuit boards or other components of information handling system 200 and/or may be associated with or enclosed within any chassis that may suit a particular embodiment. Within information handling system 200, circuit board 202 may contain, support, or otherwise be associated with one or more hardware components. For example, circuit board 202 may support hardware components such as by providing conductive pads upon which the components may be soldered, and electrical connections to allow components soldered on circuit board 202 to communicate one with another.

Hardware components on circuit board 202 may include any suitable components adapted to a particular embodiment of information handling system 200. For example, FIG. 2 illustrates components such as component 210 (e.g., component 210A in FIG. 2A and component 210B in FIG. 2B), component 212 (e.g., component 212A in FIG. 2A and component 212B in FIG. 2B), and various dual in-line memory modules (DIMMs) 220 on circuit board 202. Components 210 and 212 may represent prominent components within information handling system 200. For example, components 210 and 212 may include CPUs operating with DIMMs 220 according to principles of information handling systems described above in relation to FIG. 1. Although not explicitly shown in FIG. 2 for descriptive clarity, various other hardware components may also be included on circuit board 202. In certain examples, circuit board 202 may be very densely packed with components such that all or nearly all of circuit board 202 is utilized by components. In certain examples, a bottom side of circuit board 202 (not shown) may also include components.

Certain hardware components within information handling system 200 may be loadable and interchangeable. For example, as an alternative to directly soldering the hardware components to circuit board 202, various sockets or slots may be provided on circuit board 202 to allow the components to be dynamically loaded onto circuit board 202, removed, replaced, interchanged with other components, etc. For example, DIMMs 220 may each be seated in a DIMM slot (not expressly shown) and coupled to the DIMM slot using a locking mechanism the DIMM slot may provide. In other examples, chip-type components such as chips configured with ball grid array (BGA), pin grid array (PGA), land grid array (LGA), dual inline package (DIP), or other packaging types may also be adapted for use with a socket on circuit board 202. For example, components 210 and 212 may be configured to be seated within sockets on circuit board 202 (not expressly shown).

Certain hardware components within information handling system 200 (e.g., components included on circuit board 202) may consume power and increase in temperature during operation. If the temperature increase is not restrained, the components may reach a temperature at which the components or other components in proximity to them will fail or experience other undesirable consequences. Accordingly, the temperature of various components may be restrained by an airflow configured to carry heat away from the components and to expel the heat outside of information handling system 200.

For example, as shown in FIG. 2, one or more fans 204 (e.g., fans 204-1 through 204-n) may be configured to generate an airflow 206 for cooling information handling system 200. Airflow 206 may flow in any suitable direction. For example, fans 204 may suck air from an upstream end 208 of circuit board 202 toward a downstream end 209, as indicated by the direction of the arrows representing airflow 206. Relatively cool air may enter information handling system 200 at upstream end 208. The air may get progressively warmer as the air flows over circuit board 202 carrying away heat from various hardware components until the air is expelled by fans 204 at downstream end 209. In another example, fans 204 may be arranged near upstream end 208 and may blow air over circuit board 202 to generate airflow 206.

As shown, airflow 206 is illustrated by wavy arrows generally pointing toward downstream end 209 to represent fans 204 causing air to flow from upstream end 208 toward downstream end 209. Airflow 206 may move over components, through heat sinks associated with components, between components, etc. As airflow 206 moves from upstream end 208 to downstream end 209, airflow 206 may interact with various components and/or other protrusions along circuit board 202. For example, when airflow comes into contact with a component having a higher temperature than airflow 206, heat from the component may convectively transfer into airflow 206 to be carried away by airflow 206 out of information handling system 200. In this way, airflow 206 may facilitate cooling of the components within information handling system 200.

Airflow 206 may also be directed by various components on circuit board 202. For example, as airflow 206 comes into contact with components or other obstacles, airflow 206 may be deflected by the obstacles such that airflow 206 changes directions to move around the obstacles. In some examples, a cooling system may use obstacles such as air baffles to purposefully direct airflow 206 in a desirable direction. For example, an air baffle may be configured to direct a large portion of airflow 206 to pass over components that consume large amounts of power and/or are subject to large increases in temperature. Similarly, an air baffle may be configured to direct a smaller portion of airflow 206 to pass over components that consume small amounts of power and/or are subject to small increases in temperature.

FIG. 2 illustrates an air baffle 240 (e.g., air baffle 240A in FIG. 2A and air baffle 240B in FIG. 2B) within information handling system 200. As shown, air baffle 240 is arranged on circuit board 202 between upstream component 210 and downstream component 212. Air baffle 240 may stretch along a plane substantially perpendicular to the direction of airflow 206. For example, as shown, air baffle 240 may be arranged to stretch from one side of circuit board 202 to the other side, parallel with upstream and downstream ends 208 and 209. Air baffle 240 may be arranged in approximately the middle of circuit board 202 and may thus divide circuit board 202 into two distinct areas. For example, air baffle 240 may mark the lower boundary of an upstream area 230 that includes component 210, several DIMMs 220, and other components toward upstream end 208 of circuit board 202. Air baffle 240 may also mark the upper boundary of a downstream area 232 that includes component 212, several DIMMs 220, and other components toward downstream end 209 of circuit board 202. In dividing circuit board 202 into upstream area 230 and downstream area 232, air baffle 240 may thermally differentiate upstream area 230 from downstream area 232. Thus, the thermal characteristics of upstream area 230 such as a temperature of airflow 206 may be distinct from the thermal characteristics of downstream area 232.

Air baffle 240 may regulate a thermal impedance between upstream area 230 and downstream area 232. Thermal impedance may refer to a heat resistance of a medium, or a degree to which heat is resisted from flowing from one point to another. Thus, air baffle 240 may regulate the thermal impedance between upstream area 230 and downstream area 232 by limiting, restricting, regulating, or otherwise resisting airflow 206 as airflow 206 moves between upstream area 230 and downstream area 232 to transfer heat between upstream area 230 and downstream area 232. For example, air baffle 240 may be configured to be tall enough to approximately reach a plane above circuit board 202 such as an upper plane of a chassis in which circuit board 202 is enclosed, or another circuit board of a neighboring information handling system in a rack domain such as a blade server rack. Accordingly, because airflow 206 might not be able to go under, above, or around air baffle 240, airflow 206 may only transfer heat from upstream area 230 to downstream area 232 as directed by air baffle 240.

In FIG. 2, intensified airflow 207 illustrates portions of airflow 206 near air baffle 240 that are directed by air baffle 240. In some examples, intensified airflow 207 may have higher air pressure, air velocity, or volumetric airflow than other parts of airflow 206. In the same or other examples, intensified airflow 207 may be directed to move in a particular pattern that facilitates cooling certain components (e.g., components 210 and/or 212) at the expense of other components (e.g., DIMMs 220). For example, intensified airflow 207 may move in an hourglass shape centered in open region 244 or in a column shape approximately corresponding to open region 244, as described in more detail below.

By regulating the thermal impedance and directing airflow 206, air baffle 240 may enhance (e.g. optimize) the cooling of components of information handling system 200. For example, air baffle 240 may include a closed region 242 (e.g., closed region 242A in FIG. 2A and closed region 242B in FIG. 2B) having two sides surrounding open region 244. Closed region 242 may be configured to obstruct passage of airflow 206. For example, closed region 242 may be associated with (e.g., aligned with respect to the direction of airflow 206) components consuming a relatively small amount of power such as DIMMs 220. Because of the relatively small amount of power DIMMs 220 may consume, a relatively small portion of airflow 206 may be adequate to properly cool DIMMs 220. As such, closed region 242 may include one or more vents (not expressly shown in FIG. 2, see FIG. 3) configured to allow a relatively small portion of airflow 206 to vent through closed region 242, even as most of airflow 206 is obstructed by closed region 242. Venting will be described in more detail below.

Surrounded by the two sides of closed region 242, an open region 244 (e.g., open region 244A in FIG. 2A and open region 244B in FIG. 2B) may be configured to permit passage of airflow 206. As shown in FIG. 2, open region 244 may be associated with components 210 and 212, such as by aligning with components 210 and 212 with respect to the direction of airflow 206. Because of a relatively large amount of power that components 210 and 212 may consume, a relatively large portion of airflow 206 may be directed to cooling components 210 and 212. For example, as illustrated by intensified airflow 207, most or all of airflow 206 may be funneled through opening 244, increasing the air pressure, air velocity, and/or volumetric airflow about a column corresponding to open region 244. Because components 210 and 212 may be arranged within or about the area affected by intensified airflow 207, components 210 and 212 may be cooled more effectively than if air baffle 240 did not direct airflow 206 to generate intensified airflow 207. In this way, air baffle 240 may direct less airflow towards cooler components (e.g., DIMMs 220) and more airflow towards hotter components (e.g., components 210 and 220) to enhance and/or optimize the airflow to cool all the components efficiently.

Air baffle 240 may be configured to direct airflow 206 differently from embodiment to embodiment of information handling system 200 to optimize cooling components that may have different physical footprints and other distinctions in each embodiment. More specifically, air baffle 240 may generate intensified airflow 207 to follow different patterns or have different characteristics in various embodiments. In certain examples, a thermal impedance parameter associated with cooling components 210 and/or 212 may be designated for a particular embodiment of information handling system 200. If the thermal impedance parameter is high, air baffle 240 may regulate the thermal impedance to satisfy the thermal impedance parameter by directing airflow 206 to generate intensified airflow 207 to be relatively narrow. More specifically, air baffle 240 may only allow passage of airflow 206 through a relatively narrow open region 244. Conversely, if the thermal impedance parameter is low, air baffle 240 may regulate the thermal impedance to satisfy the thermal impedance parameter by allowing passage of airflow 206 to generate intensified airflow 207 to be relatively wide. More specifically, air baffle 240 may allow passage of airflow 206 through a relatively wide open region 244.

As shown in FIG. 2, for example, components 210 and 212 may have different physical footprints in the different embodiments shown in FIGS. 2A and 2B. Specifically, in the embodiment of FIG. 2A, components 210A and 212A may have relatively narrow footprints, which may correspond to a relatively high thermal impedance parameter to cool components 210A and 212A. For example, components 210A and 212A and heat sinks associated with components 210A and 212A may be 68 millimeters (mm) in width. Thus, as shown, components 210A and 212A are narrow enough with respect to the direction of airflow 206 that five DIMMs 220 fit on either side of components 210A and 212A on circuit board 202. As further shown, both sides of closed region 242A may be relatively wide, and open region 244A may be relatively narrow (e.g., approximately 68 mm) to regulate the thermal impedance to satisfy the high thermal impedance parameter.

Conversely, in the embodiment of FIG. 2B, components 210B and 212B may have relatively wide footprints with respect to the direction of airflow 206. For example, components 210B and 212B and heat sinks associated with components 210B and 212B may be 86 mm in width. As a result, only four DIMMs 220 may fit on either side of components 210B and 212B on circuit board 202, rather than five DIMMs 220, as fit in either side of components 210A and 212A in FIG. 2A. Both sides of closed region 242B may be relatively narrow, while open region 244B may be relatively wide (e.g., approximately 86 mm) to regulate the thermal impedance to satisfy the low thermal impedance parameter. In both exemplary embodiments of FIG. 2, open region 244 may approximately correspond to the width of the footprint of component 210 and/or component 212 such that airflow 206 is configured to enhance the cooling of components on circuit board 202 by increasing the intensity of airflow 206 near components 210 and 212 and reducing the intensity elsewhere on circuit board 202.

In certain examples, different air baffles 244A and 244B may be employed to correspond to the different relative widths of components 210 and 212 in different embodiments of information handling system 200 shown in FIGS. 2A and 2B. For example, if a single manufacturer produces both embodiments of information handling system 200, two distinct air baffles 240A and 240B may used with the relative information handling systems 200. Accordingly, various costs and/or risks may accrue to the manufacturer related to maintaining two distinct stock keep units (SKUs) in the inventory system of the manufacturer. For example, twice as many orders may be placed to keep two distinct products in stock rather than one. Neither product may be consumed in a sufficiently high volume to receive premium prices from suppliers that might have been obtained if only one air baffle was ordered. Storage costs may be greater for two SKUs than for one. Similar air baffles may be inadvertently installed on incorrect circuit boards such that thermal impedance parameters may not be satisfied and components may overheat as a result of not being sufficiently cooled. Various other examples of costs and risks associated with maintaining two SKUs of air baffles may also exist in various embodiments of information handling system 200. Additionally, the seriousness of each of these costs and risks may substantially grow in proportion to the number of distinct SKUs of air baffles used by the manufacturer. For example, a large manufacturing concern may produce dozens of different information handling systems with different circuit boards, different components, and different air baffles. Accordingly, many costs and risks may be alleviated by using an embodiment of air baffle 240 that is customizable to take on various properties associated with air baffles 240A, 240B, and/or other air baffles associated with other components having footprints (e.g., relative widths) distinct from components 210A, 212A, 210B, or 212B.

Figure 3A:
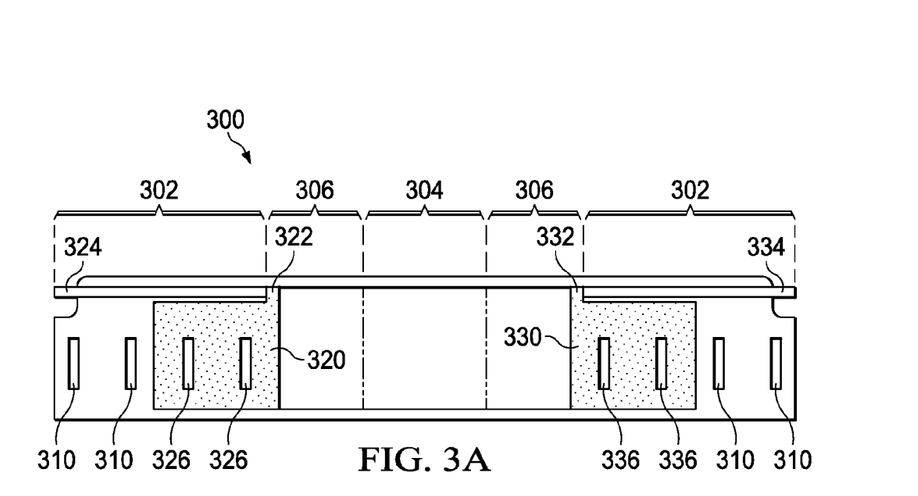
FIG. 3A is a side view of selected elements of an embodiment of a configurable air baffle used within an information handling system having adjustable tabs configured in a relatively wide position.
Figure 3B:
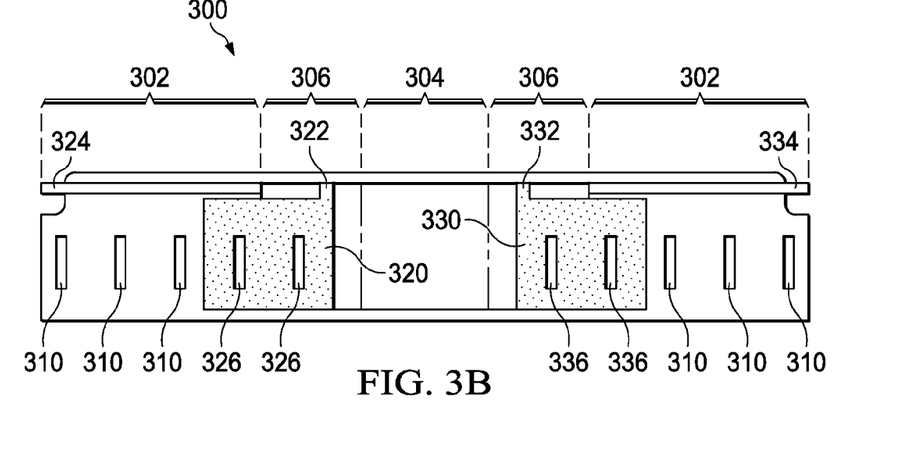
FIG. 3B is a side view of selected elements of an embodiment of a configurable air baffle used within an information handling system having adjustable tabs configured in a relatively narrow position.

FIG. 3 (e.g., FIGS. 3A and 3B) illustrates a side view of selected elements of an embodiment of a configurable air baffle 300 used within an information handling system having adjustable tabs configured in different positions. Specifically, FIG. 3A illustrates air baffle 300 having adjustable tabs configured in a relatively wide position. FIG. 3B illustrates air baffle 300 having adjustable tabs configured in a relatively narrow position. Air baffle 300 may be employed in either or both of the embodiments of information handling system 200 discussed above in relation to FIG. 2. Air baffle 300 may not be drawn to scale and may have more or fewer elements in various embodiments than those shown in FIG. 3. Air baffle 300 may represent an embodiment of air baffle 240A and/or air baffle 240B discussed above in relation so FIG. 2.

Air baffle 300 may include a closed region 302 corresponding to closed region 242 of air baffle 240. Closed region 302 may be configured to obstruct passage of an airflow. For example, if air baffle 300 were installed in information handling system 200, closed region 302 may obstruct passage of airflow 206 when fans 204 are engaged. As shown, closed region 302 may include one or more vents 310 configured to allow a portion of the airflow being obstructed to vent through closed region 302. For example, if air baffle 300 were employed within information handling system 200 shown in FIG. 2, closed region 302 may include one vent 310 to correspond to each DIMM 220. Accordingly, when airflow 206 is flowing during system operation, each DIMM 220 may receive a portion of airflow 206 through a corresponding vent 310, but the portion may be relatively small as a result of the relatively small amount of power that DIMMs 220 may consume. Rather, a larger portion of airflow 206 may be obstructed by closed region 302 and directed to flow through open region 304 to be facilitate cooling components consuming more power such as components 210 and/or 212.

Air baffle 300 may further include open region 304 corresponding to open region 244 of air baffle 240. Open region 304 may be surrounded by closed region 302 and may be configured to permit passage of an airflow. Thus, for example, if air baffle 300 is installed in information handling system 200, open region 304 may permit passage of airflow 206 to generate intensified airflow 207 when fans 204 are engaged. The width of open region 304 may correspond to a highest thermal impedance that air baffle 300 may be configured to regulate. For example, open region 304 may be as wide as the narrowest width by which air baffle 300 is configured to direct airflow in an information handling system.

In addition to closed and open regions 302 and 304 corresponding to regions of air baffle 240, air baffle 300 may also include a variable region 306. As shown, variable region 306 may include two sides surrounding open region 304, similar to closed region 302. More specifically, each side of variable region 306 may be respectively arranged between open region 304 and each side of closed region 302. Variable region 306 may be configured to permit and obstruct passage of an airflow based on a position of adjustable tabs 320 and 330 with respect to each respective side of variable region 306. Accordingly, various positions of adjustable tabs 320 and 330 may be configured to regulate thermal impedance between an upstream area and a downstream area that air baffle 300 thermally differentiates to satisfy a thermal impedance parameter associated with cooling components within the upstream and downstream areas, as discussed above in relation to FIG. 2. For example, one position of adjustable tabs 320 and 330 may configure open region 304 to be approximately 68 mm wide to correspond with components such as components 210A and 212A (see FIG. 2A), while another position of adjustable tabs 320 and 330 may configure open region 304 to be approximately 86 mm wide to correspond with wider components such as components 210B and 212B.

More particularly, as shown in FIG. 3A, adjustable tabs 320 and 330 may be positioned at outer edges of respective sides of variable region 306 to configure air baffle 300 in a wide configuration (e.g., having an open region of 86 mm). Thus, in the example of FIG. 3A, variable region 306 may be continuously joined with open region 304 and the passage of airflow may be permitted all throughout open region 304 and variable region 306.

FIG. 3B shows a narrower position of adjustable tabs 320 and 330 with respect to variable region 306 (e.g., to create an open region of 68 mm). As shown in FIG. 3B, adjustable tabs 320 and 330 may be positioned to partially align with respective sides of closed region 302 and to partially align with corresponding sides of variable region 306. Accordingly, based on the position of adjustable tabs 320 and 330 with respect to variable region 306, variable region 306 may be configured to both permit and obstruct passage of airflow. Specifically, the open parts of variable region 306 continuous with open region 304 may permit passage of the airflow, while the parts of variable region 306 aligned with adjustable tabs 320 and 330 may obstruct passage of the airflow.

In certain examples, both adjustable tabs may advantageously be positioned symmetrically with respect to a center of open region 304. For example, as shown in FIG. 3B, adjustable tab 320 may positioned partially within one side of variable region 306 and adjustable tab 330 may be symmetrically positioned partially within the other side of variable region 306. In other examples, adjustable tabs 320 and 330 may each be independently positioned without regard for whether one is symmetrical to the other. According to the relative widths of open region 304, closed region 302, variable region 306, and adjustable tabs 320 and 330, various widths corresponding to various components and thermal impedance parameters may be accommodated with only air baffle 300. For example, while 68 mm and 86 mm widths have been used as an example, wider or narrower widths or widths between 68 mm and 86 mm may also be accommodated by air baffle 300 in various embodiments. As such, air baffle 300 may be associated with only one SKU in an inventory of a manufacturer, thus providing the advantages and alleviating the risks described above.

As shown, adjustable tabs 320 and 330 may be slidably coupled to air baffle 300 so as to move along closed region 302 and variable region 306 to a suitable position with respect to variable region 306 (e.g., a position corresponding to a width of a component to be cooled). Accordingly, adjustable tabs 320 and 330 may be associated, respectively, with tracks 324 and 334 to facilitate adjustable tabs 320 and 330 sliding from positions mostly or completely aligned with closed region 302 to positions mostly or completely aligned with variable region 306. Adjustable tabs 320 and 330 may also include one or more stops to limit adjustable tabs 320 and 330 from sliding beyond a certain part of closed region 302 and/or variable region 306. For example, stop 322 may limit adjustable tabs 320 and 330 from sliding any further to the outside of air baffle 300. A similar stopping mechanism (not shown) may limit adjustable tabs 320 and 330 from sliding too far to the inside of air baffle 300 (e.g., to align with open region 304).

While two adjustable tabs 320 and 330 are shown in FIG. 3, any suitable number of adjustable tabs and corresponding parts of variable region 306 may be employed in various embodiments. For example, one adjustable tab may be employed to be positioned along one variable region rather than two. In other examples, more than two adjustable tabs may be employed to correspond to more than two variable regions and, possibly, more than one open region.

As shown, adjustable tab 320 may include one or more vents 326, and adjustable tab 330 may include one or more vents 336. Vents 326 and 336 may allow venting for a portion of an airflow being obstructed by closed region 302 and/or a part of variable region 306, in order to facilitate cooling lower-power components such as DIMMs 220, described above (see FIG. 2). Accordingly, vents 326 and 336 may correspond to vents 310 of closed region 302. Specifically, vents 326 and 336 may be configured to align with vents 310 when adjustable tabs 320 and 330 are in one of a plurality of discrete alignment positions.

Discrete alignment positions may be available for adjustable tabs 320 and 330. For example, while adjustable tabs 320 and 330 may be configured to slide continuously along tracks 324 or 334 to cover any portion of variable region 306, vents 326 and 336 may only properly align with vents 310 when adjustable tabs 320 are in particular positions. Additionally, components that air baffle 300 is employed to help cool may come in several discrete, standardized widths. Accordingly, selecting one of a plurality of discrete alignment positions for adjustable tabs 320 and 330 may be preferable to selecting other positions that adjustable tabs 320 and 330 might have where the vents would not properly align and/or which would not correspond with standardized component widths. Air baffle 300 may thus include a tab retention feature associated with adjustable tabs 320 and/or 330, the tab retention feature configured to set and retain adjustable tabs 320 and/or 330 in a particular one of the plurality of discrete alignment positions corresponding to standardized component widths and/or where vents 326 and 336 align with vents 310.

Figure 4:
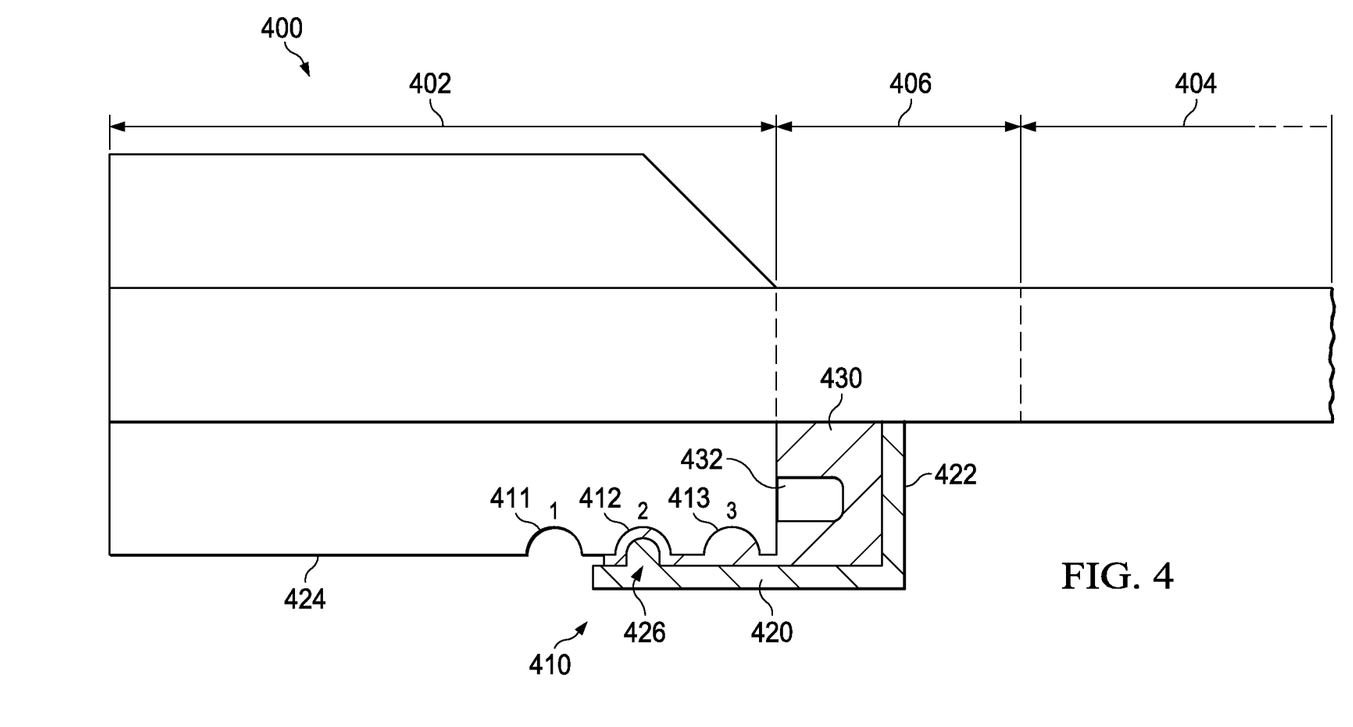
FIG. 4 is a top view of selected elements of an embodiment of a configurable air baffle used within an information handling system.

FIG. 4 is a top view of selected elements of an embodiment of a configurable air baffle 400 used within an information handling system. Air baffle 400 may be an embodiment of air baffle 300, discussed above in relation to FIG. 3. Air baffle 400 may be employed in an information handling system such as information handling system 200 discussed above in relation to FIG. 2. Air baffle 400 may not be drawn to scale and may have more or fewer elements in various embodiments than those shown in FIG. 4. For example, only a single side of air baffle 400 may be illustrated in FIG. 4, while another side may be omitted. The omitted side of air baffle 400 not shown may be substantially similar or symmetrical with the side pictured in FIG. 4.

As shown, air baffle 400 may include closed region 402, which may obstruct passage of an airflow and which may include vents for allowing a portion of the airflow to vent through closed region 402. Because FIG. 4 illustrates a top view of air baffle 400, vents are not pictured in FIG. 4. Air baffle 400 may also include variable region 406 and at least a portion of open region 404, as shown. Closed region 402, variable region 406, and open region 404 may have similar or the same properties as, respectively, closed region 302, variable region 306 and open region 304, described above in relation to air baffle 300 in FIG. 3. Air baffle 400 may also include adjustable tab 420 and track 424, which may have similar or the same properties as, respectively, adjustable tab 320 and track 324. For example, adjustable tab 420 may be slidably coupled to track 424 so as to move along closed region 402 and variable region 406. Specifically, an elongated opening 432 at the top of adjustable tab 420 may be fastened to the underside of track 424 in such a way that elongated opening 432 is free to slide laterally back and forth along track 424 while securely attached to track 424.

As shown, air baffle 400 may also include a retention feature 410, including a bump 426 on adjustable tab 420 that is configured to fit into one of indentations 411, 412, and/or 413. More specifically, retention feature 410 may be configured to set and retain adjustable tab 420 in one of a plurality of discrete alignment positions labeled on track 424 as positions 1, 2, and 3. As shown, each discrete alignment position may correspond with one of indentations 411, 412, and 413 on track 424. In various embodiments, more or fewer discrete alignment positions may be included in retention feature 410. As shown, adjustable tab 420 may include a flat portion 430 that may attach to and/or slide along track 424. Flat portion 430 may be bordered on one or more sides by a stop portion 422 that may be vertically offset from flat portion 430 such that stop portion 422 may form a raised lip around part of flat portion 430 to interact with (e.g., collide with) track 424. Specifically, stop portion 422 may be configured to limit adjustable tab 420 from sliding too far toward the outer edge of air baffle 400. To distinguish flat portion 430 from stop portion 422 in FIG. 4, flat portion 430 is shown with one type of cross-hatching while stop portion 422 is illustrated with a different type of cross-hatching.

Stop portion 422 may include a bump 426 configured to cooperate with indentations 411, 412, and 413 on track 424 corresponding to the various discrete alignment positions. Specifically, as shown, bump 426 may fit into one of indentations 411, 412, and/or 413 as adjustable tab 420 slides along track 424. When bump 426 is accepted into any of indentations 411, 412, and/or 413, adjustable tab 420 may be configured to properly align with closed region 402 such that vents on adjustable tab 420 line up with vents on closed region 402 (e.g., see FIG. 3). Additionally, by accepting bump 426 into one of indentations 411, 412, and/or 413, retention feature 410 may retain adjustable tab 420 such that adjustable tab 420 will not inadvertently slide along track 424 to an undesirable position. For example, bump 426 and indentations 411, 412, and 413 of retention feature 410 may help ensure that adjustable tab 420 does not slide into a position where vents on adjustable tab 420 would not properly line up with vents on closed portion 402. As such, retention feature 410 may help prevent an improperly aligned configuration of air baffle 400 that could interfere with properly cooling components that rely on vented airflow (e.g., DIMMs 220, described above in relation to FIGS. 2 and 3).

Retention feature 410 may allow adjustable tab 420 to take any of positions 1, 2, or 3 (e.g., corresponding, respectively, to indentations 411, 412, and 413) that may be suitable for a particular embodiment. For example, if an information handling system has components with narrow footprints, retention feature 410 may allow adjustable tab 420 to be set and retained within discrete alignment position 3. Components 210A and 212A of information handling system 200 in FIG. 2A may provide examples of components with narrow footprints. For example, components 210A and 212A may be approximately 68 mm in width and may be associated with relatively high thermal impedance. Conversely, if an information handling system has components with wide footprints, retention feature 410 may allow adjustable tab 420 to be set and retained within discrete alignment position 1. For example, components 210B and 212B of information handling system 200 in FIG. 2B may have relatively wide footprints. Specifically, components 210B and 212B may be approximately 86 mm in width and may be associated with relatively low thermal impedance. In between these endpoints, a moderate position such as position 2 may be suitable for other embodiments.

Certain information handling systems may include components to be cooled that do not perfectly correspond to any discrete alignment position (e.g., positions 1, 2, or 3) available on air baffle 400. For example, components may be narrower than open region 404 corresponding to discrete alignment position 3, wider than the combination of open region 404 and variable region 406 corresponding to discrete alignment position 1, or not quite corresponding to a moderate position such as position 2. In such situations, adjustable tabs 420 may be set to a suitable alignment position approximating the width of the desired alignment position, or may be replaced by customized adjustable tabs having the desired alignment position. These possible solutions will be discussed in more detail below.

Figure 5:
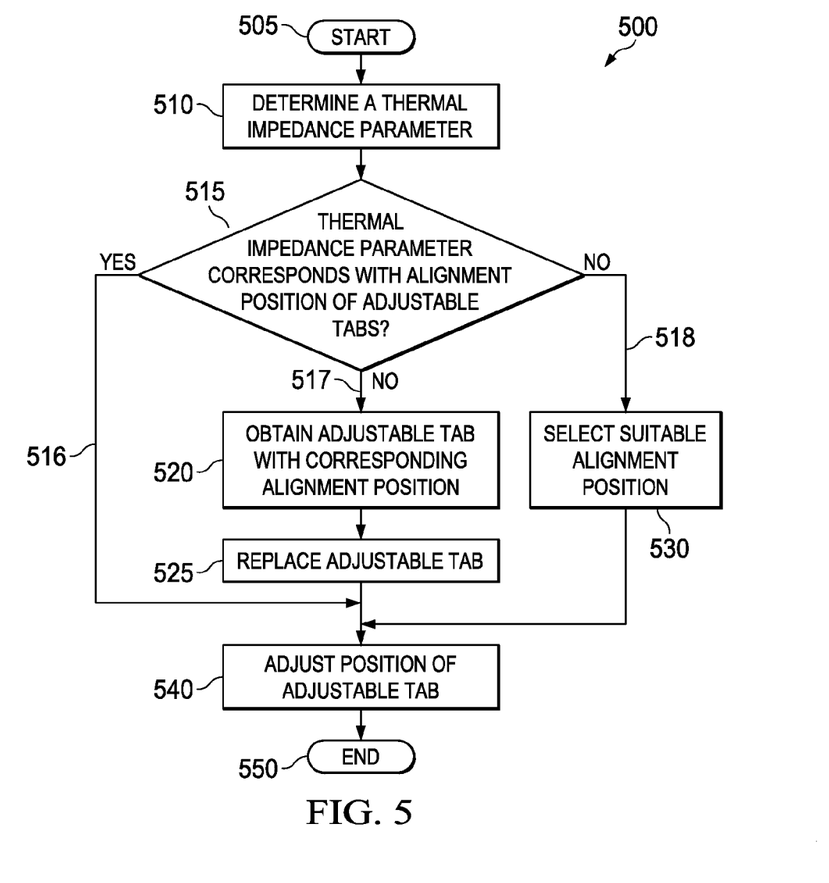
FIG. 5 is a flowchart depicting selected elements of an embodiment of a method for directing airflow within an information handling system.

FIG. 5 is a flowchart depicting selected elements of an embodiment of a method 500 for directing airflow within an information handling system. Method 500 may be performed by any suitable operator, user, manufacturer or other person associated with an information handling system that includes a configurable air baffle. For example, an air baffle described in relation to method 500 may be similar to air baffle 400, described above in relation to FIG. 4. Specifically, the air baffle described in relation to method 500 may include an open region configured to permit passage of an airflow, a closed region configured to obstruct passage of the airflow, an adjustable tab configured to obstruct passage of the airflow, and a variable region between the open region and the closed region that may allow or obstruct airflow based on a position of the adjustable tab. Although the adjustable tab may be described in the singular, it will be understood that one or more additional adjustable tabs included on the air baffle may be identically or similarly treated. Like air baffle 400, the air baffle referred to below may include vents on one or both of the adjustable tabs and the closed region and may thus include a plurality of discrete alignment positions in which the adjustable tabs may be set and retained.

In method 500, additional operations may be performed in addition to the explicit steps described. For example, fabricating or otherwise obtaining the air baffle and installing the air baffle in the information handling system may be performed prior to beginning method 500. Similarly, certain operations described in method 500 may be optional or may be rearranged in different embodiments.

From start 505, method 500 may move to step 510. At step 510, method 500 may include determining a thermal impedance parameter associated with cooling at least one of an upstream area and a downstream area of the information handling system. For example, as illustrated and described above in relation to FIG. 2, the upstream area and the downstream area may be arranged on either side of the air baffle stretching across a circuit board of the information handling system. The thermal impedance parameter may be associated with regulating and/or directing airflow, and heat carried by the airflow, between the upstream area and the downstream area. For example, where high-power components in the upstream and downstream areas are relatively narrow, the thermal impedance parameter may be determined to be relatively high to direct a relatively large portion of the airflow over the relatively narrow components. In other examples, where high-power components in the upstream and/or downstream areas are relatively wide, the thermal impedance parameter may be determined to be relatively low to direct the large portion of the airflow over the wider components. Determining the thermal impedance parameter may be performed in accordance with various examples discussed in relation to FIG. 2. Method 500 may move to decision point 515.

At decision point 515, method 500 may branch off to various steps dependent on the thermal impedance parameter determined at step 510 and whether the thermal impedance parameter corresponds with a discrete alignment position available on the air baffle. For example, the thermal impedance parameter may be associated with cooling components that are associated with a particular discrete alignment position (e.g., 68 mm) on the air baffle. If such a corresponding position is available, method 500 may move to step 540 via "yes" decision 516. However, if no such corresponding position is available in the plurality of discrete alignment positions of the air baffle, method 500 may follow either "no" decision 517 or "no" decision 518 to move, respectively, to step 520 or to step 530.

At step 520, method 500 may include obtaining an adjustable tab with a customized alignment position corresponding to the thermal impedance parameter determined at step 510. For example, the adjustable tabs may be constructed of a polymeric material that is easily and/or inexpensively molded such that a new, customized adjustable tab configured to correspond to the desired discrete alignment position may be readily fabricated or otherwise obtained. In various examples, the customized adjustable tab obtained may be longer or shorter than the default adjustable tab that lacked the desirable alignment position, or may have a bump (see FIG. 4) and/or vents (see FIG. 3) arranged such that the desired portion of the variable region of the air baffle may allow passage of airflow while the adjustable tab is retained in a particular alignment position. Once the new adjustable tab is obtained, method 500 may move to step 525.

At step 525, the adjustable tab newly obtained at step 520 and configured to have the discrete alignment position corresponding to the thermal impedance parameter determined at step 510 may replace a default adjustable tab of the air baffle. For example, a fastener coupling the default adjustable tab to a track on the air baffle may be released or undone such that the default adjustable tab may be removed. Thereafter, the fastener may be used to couple the newly obtained adjustable tab to the track to replace the default adjustable tab. Method 500 may then move to step 540.

If no discrete alignment position corresponds to the thermal impedance parameter at decision point 515, method 500 may move to step 530 via "no" decision 518 as an alternative to moving to step 520 via "no" decision 517. At step 530, rather than obtaining a new adjustable tab, method 500 may select a suitable alignment position from the plurality of discrete alignment positions that are available on the default adjustable tab. For example, a suitable alignment position approximating the alignment position corresponding to the thermal impedance parameter may be selected. Method 500 may then move to step 540.

At step 540, method 500 may include adjusting the position of the adjustable tab with respect to the variable region of the air baffle to regulate the thermal impedance between the upstream area and the downstream area to satisfy the thermal impedance parameter determined at step 510. For example, if the thermal impedance parameter corresponds to an available alignment position with the default adjustment tabs installed, step 540 may include moving the default adjustable tab into the corresponding discrete alignment position. If the thermal impedance parameter does not correspond to an available alignment position with the default adjustment tabs, but a newly-obtained adjustment tab has replaced the default at step 525, step 540 may include moving the newly-obtained adjustable tab into the corresponding discrete alignment position. If the thermal impedance parameter does not correspond to an available alignment position with the default adjustment tab, but a suitable alignment position was selected at step 530, step 540 may include moving the default adjustable tab into the suitable alignment position selected. After adjusting the position of the adjustable tab to correspond to the thermal impedance parameter, method 500 may move to end 550.

An air baffle for directing air within an information handling system is disclosed. The air baffle includes an open region configured to permit passage of an airflow, a closed region configured to obstruct passage of the airflow, and a variable region between the open region and the closed region. The air baffle further includes an adjustable tab configured to obstruct passage of the airflow. The variable region is configured to permit and obstruct passage of the airflow based on a position of the adjustable tab with respect to the variable region.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An air baffle for directing air within an information handling system, the air baffle comprising:
   a open region configured to permit passage of an airflow;
   a closed region configured to obstruct passage of the airflow, the closed region including one or more vents configured to allow a portion of the airflow being obstructed to vent through the closed region;
   a first adjustable tab configured to obstruct passage of the airflow, the first adjustable tab including one or more vents configured to align with the vents of the closed region when the first adjustable tab is in one of a plurality of discrete alignment positions; and
   a first variable region between the open region and a first side of the closed region, the first variable region configured to permit and obstruct passage of the airflow based on a position of the first adjustable tab with respect to the first variable region.

2. The air baffle of claim 1, wherein:
the information handling system includes components arranged on a circuit board;
the air baffle is arranged on the circuit board between the components along a plane perpendicular to a direction of the airflow; and
the air baffle is configured to:
thermally differentiate an upstream area of the circuit board from a downstream area of the circuit board; and
direct the airflow moving from the upstream area to the downstream area to enhance the cooling of the components.

3. The air baffle of claim 2, wherein the position of the first adjustable tab is configured to regulate a thermal impedance between the upstream area and the downstream area to satisfy a thermal impedance parameter associated with cooling the components.

4. The air baffle of claim 1, wherein the open region is arranged between the first side and a second side of the closed region, the air baffle further comprising:
a second adjustable tab obstructing passage of the airflow; and
a second variable region between the open region and the second side of the closed region, the second variable region configured to permit and obstruct passage of the airflow based on a position of the second adjustable tab with respect to the second variable region.

5. The air baffle of claim 4, wherein the positions of the first and the second adjustable tabs are symmetrical with respect to a center of the open region.

6. The air baffle of claim 1, wherein the air baffle further comprises a tab retention feature associated with the first adjustable tab, the tab retention feature configured to set and retain the first adjustable tab in one of the plurality of discrete alignment positions.

7. The air baffle of claim 1, wherein the plurality of discrete alignment positions include a first discrete alignment position associated with an opening approximately 68 millimeters (mm) wide and a second discrete alignment position associated with an opening approximately 86 mm wide.

8. The air baffle of claim 1, wherein the first adjustable tab is slidably coupled to the air baffle so as to move along the closed region and the first variable region to the position with respect to the first variable region.

9. An information handling system comprising:
a fan configured to generate an airflow;
an upstream component configured to be cooled by the airflow;
a downstream component configured to be cooled by the airflow; and
an air baffle arranged between the upstream and downstream components configured to direct the airflow, the air baffle including:
an open region configured to permit passage of the airflow;
a closed region configured to obstruct passage of the airflow;
a first adjustable tab configured to obstruct passage of the airflow; and
a first variable region between the open region and a first side of the closed region, the first variable region configured to permit and obstruct passage of the airflow based on a position of the first adjustable tab with respect to the first variable region.

10. The information handling system of claim 9, further comprising a circuit board on which the upstream and downstream components are arranged and wherein:
the air baffle is arranged on the circuit board along a plane perpendicular to a direction of the airflow; and
the air baffle is further configured to:
thermally differentiate an upstream area of the circuit board from a downstream area of the circuit board; and
direct the airflow moving from the upstream area to the downstream area to enhance the cooling of at least one of the upstream and the downstream components.

11. The information handling system of claim 10, wherein the position of the first adjustable tab is configured to regulate a thermal impedance between the upstream area and the downstream area to satisfy a thermal impedance parameter associated with cooling at least one of the upstream and the downstream components.

12. The information handling system of claim 9, wherein the open region is arranged between the first side and a second side of the closed region, the air baffle further comprising:
a second adjustable tab obstructing passage of the airflow; and
a second variable region between the open region and the second side of the closed region, the second variable region configured to permit and obstruct passage of the airflow based on a position of the second adjustable tab with respect to the second variable region.

13. The information handling system of claim 12, wherein the positions of the first and the second adjustable tabs are symmetrical with respect to a center of the open region.

14. The information handling system of claim 9, wherein:
the closed region includes one or more vents configured to allow a portion of the airflow being obstructed to vent through the closed region; and
the first adjustable tab includes one or more corresponding vents configured to align with the vents of the closed region when the first adjustable tab is in one of a plurality of discrete alignment positions.

15. The information handling system of claim 14, wherein the air baffle further comprises a tab retention feature associated with the first adjustable tab, the tab retention feature configured to set and retain the first adjustable tab in one of the plurality of discrete alignment positions.

16. The information handling system of claim 9, wherein the first adjustable tab is slidably coupled to the air baffle so as to move along the closed region and the first variable region to the position with respect to the first variable region.

17. A method for directing air within an information handling system, comprising:
determining a thermal impedance parameter associated with cooling at least one of an upstream area and a downstream area of the information handling system on opposite sides of an air baffle, the air baffle including:
an open region configured to permit passage of an airflow;
a closed region configured to obstruct passage of the airflow;
an adjustable tab configured to obstruct passage of the airflow; and
a variable region between the open region and the closed region, the variable region configured to permit and obstruct passage of the airflow based on a position of the adjustable tab with respect to the variable region; and adjusting the position of the adjustable tab with respect to the variable region to regulate a thermal impedance between the upstream area and the downstream area to satisfy the thermal impedance parameter.

18. The method of claim 17, wherein:

the closed region includes one or more vents to allow a portion of the airflow being obstructed to vent through the closed region;

the adjustable tab includes one or more corresponding vents configured to align with the vents of the closed region when the adjustable tab is in one of a plurality of discrete alignment positions; and adjusting the position of the adjustable tab includes moving the adjustable tab into one of the plurality of discrete alignment positions.

19. The method of claim 18, further comprising:

determining that the adjustable tab lacks an alignment position corresponding to the thermal impedance parameter; and selecting a suitable alignment position from the plurality of discrete alignment positions, the suitable alignment position approximating the alignment position corresponding to the thermal impedance parameter;

wherein adjusting the position of the adjustable tab based on the thermal impedance parameter includes moving the adjustable tab into the suitable alignment position.

\* \* \* \* \*